United States Patent [19]

Herb et al.

[11] Patent Number: 5,325,384
[45] Date of Patent: Jun. 28, 1994

[54] STRUCTURE AND METHOD FOR MOUNTING LASER DIODE ARRAYS

[75] Inventors: John A. Herb, Palo Alto; John M. Pinneo, Redwood City, both of Calif.

[73] Assignee: Crystallume, Menlo Park, Calif.

[21] Appl. No.: 818,286

[22] Filed: Jan. 9, 1992

[51] Int. Cl.$^5$ .............................. H01S 3/045
[52] U.S. Cl. .......................... 372/36; 372/75
[58] Field of Search ..................... 372/36, 75

[56] References Cited

U.S. PATENT DOCUMENTS

| | | | |
|---|---|---|---|
| 3,303,432 | 2/1967 | Garfinkel et al. | 372/36 |
| 3,351,698 | 11/1967 | Marinace | 372/36 |
| 3,590,248 | 6/1971 | Chatterton, Jr. | 372/36 |
| 4,716,568 | 12/1987 | Scifres et al. | 372/36 |
| 4,719,631 | 1/1988 | Conaway | 372/75 |
| 5,099,488 | 3/1992 | Ahrabi et al. | 372/36 |

Primary Examiner—James W. Davie
Attorney, Agent, or Firm—D'Alessandro, Frazzini & Ritchie

[57] ABSTRACT

A carrier for a laser diode bar comprises a generally rectangularly shaped block formed from a dielectric material having a high thermal conductivity. The block includes a stepped recess formed therein having a height essentially equal to one half the height of a laser diode bar to be mounted thereon. An assembly for mounting a laser diode bar comprises a pair of carriers in contact with one another and oriented such that their stepped recesses are in facing relationship to one another. A laser diode bar is positioned between the carriers in the space left by their combined stepped recesses. A plurality of assemblies may be placed in contact with or separated from one another.

8 Claims, 2 Drawing Sheets

STRUCTURE AND METHOD FOR MOUNTING LASER DIODE ARRAYS

BACKGROUND OF THE INVENTION

1. Field of the Invention

The present invention relates to laser diode arrays. More specifically, the present invention relates to structures and methods for mounting laser diode arrays.

2. The Prior Art

Most laser diodes, particularly those operating at high power are typically mounted by soldering the laser diode or laser diode array to a heat spreader formed from a thermally conductive material such as diamond or copper. The heat spreader is itself fixed to a sub-mount formed from a thermally conductive material such as copper. This final assembly is attached to a finned heat sink or a thermal electric cooler. The sizes and shapes of the various pieces and overall assembly can vary depending on the application.

Most of the design considerations for a particular mounting scheme are as much concerned with ease of assembly as with efficiency of heat removal. Because only the D.C. electrical characteristics and not light output of an individual laser diode can be tested in wafer form, individual laser diodes are typically mounted on the heat spreader and/or sub-mount and are then tested before committing to final assembly. This two-step assembly procedure is important in order to maintain acceptable yield. Rework, necessitated by a poor or inoperative individual laser diode in a laser diode array, is expensive after final assembly; thus the mounting components and procedures are designed so that the laser can be tested optically as soon as possible and subsequent handling of the laser itself is minimized. Relative and absolute thermal expansion of the parts is important in applications such as fiber-optic communications where alignment and stability is important.

For high power applications, such as diode-pumped YAG lasers requiring concentrated high intensity laser radiation sources, such as laser diode arrays which may have many (50–100) emitting regions in a single 1 cm by 0.08 cm bar, a "rack and stack" approach is often employed which is extremely effective for removing high heat flux.

The laser diode array is soldered to a heat spreader which carries the heat from the device to a cooled backplane which acts as the heat sink removing the heat. The basic rack and stack unit is repeated by stacking units one above another, resulting in a very compact concentrated high power laser light source with very high heat removal capability. Sometimes an insulating spacer is mounted on top of the heat spreader to aid in assembly and to act as a wire bonding pad. As discussed above with the conventional mount, the laser diode array is first attached to a heat spreader or sub-mount which facilitates optical testing before final assembly. Once the laser diode array optical performance is confirmed, the bars are then attached to the heat sink, a difficult process when many bars are stacked on top of one another. In addition, since electrical current passes top to bottom through the laser diode array, care must be taken not to electrically short the laser diode array and to isolate it properly from the other laser diode arrays and the heat sink.

Because the laser diode arrays used in these applications dissipate large amounts of heat into small areas, the heat spreader must have good thermal properties as well as allow easy test and mounting. The heat sinks or cooled backplanes to which the mounted laser diode array is attached must be able to remove large quantities of heat from a small area. The advanced heat sinks used in these applications are typically impingement coolers or microchannel coolers. The impingement cooler sprays a cooling fluid directly against the backplane and is then recirculated through another cooling stage. A microchannel cooler, shown in the schematic above, circulates a fluid through narrow channels etched in a material such as silicon. Properly designed, these devices can handle considerable heat fluxes.

In one instance, developed by Lawrence Livermore Laboratory, a rack and stack mounting scheme has been developed where the heat sink to which the laser diode array is attached is itself a microchannel cooler. Thus in the rack and stack embodiment, laser diode arrays are mounted on individual microchannel coolers and this assembly stacked up. This requires solving complex design problems on how to get high pressure cooling fluid efficiently to all the coolers and how to channel electrical current through the coolers themselves.

In view of the state of the art, there exists a need for providing a structure and method for mounting an array of laser diode emitters which overcomes the shortcomings of the prior art, which include difficulty of assembly leading to high cost and low yield, and the difficulty with working with high thermal conductivity materials to form rack and stack components.

It is an object of the present invention to improve heat removal from laser diode arrays.

It is another object of the present invention to reduce laser diode array assembly complexity and to reduce yield losses during laser diode array assembly.

It is a further object of the present invention to improve mechanical alignment precision of laser diode arrays, and to reduce the complexity of power supply metallization patterning for laser diode arrays.

BRIEF DESCRIPTION OF THE INVENTION

A laser diode bar carrier according to the present invention comprises a generally rectangular shaped block of dielectric material incorporating a stepped recess to accommodate a laser diode array. The stepped recess is preferably essentially half the thickness of a laser diode array to be mounted thereon. According to a presently preferred embodiment of the invention, a laser diode array is mounted on two opposed faces of the stepped recess portions of a pair of laser diode bar carriers. The laser diode array is attached to the dielectric laser bar carriers using a suitable bonding technology, such as eutectic bonding, adhesive bonding, or other method. Metallization patterns placed on the bar carriers provide power supply voltage potentials to the diode emitters on the laser diode bars. The thickness of the laser bar carriers can be varied to optimize the tradeoff between vertical laser stacking density and lateral thermal resistance.

The laser bar carriers according to the present invention may be fabricated from a variety of materials. Materials which are excellent thermal conductors and electrical insulators are desirable, and diamond and beryllium oxide are two such materials. Diamond is the optimum material from the point of view of thermal properties and thermomechanical stability. Metallization patterns for supplying power to the laser arrays may be formed on the faces of the laser bar carriers to allow powering the laser arrays in a variety of configurations. If the laser bar is constructed so as to permit, the diodes can be powered individually by leading metallization traces from the laser bar to the backplane, or cooling plate region. This can allow differential powering of individual diodes to compensate for unit variation.

DETAILED DESCRIPTION OF A PREFERRED EMBODIMENT

Those of ordinary skill in the art will realize that the following description of the present invention is illustrative only and not in any way limiting. Other embodiments of the invention will readily suggest themselves to such skilled persons.

Figure 1A:
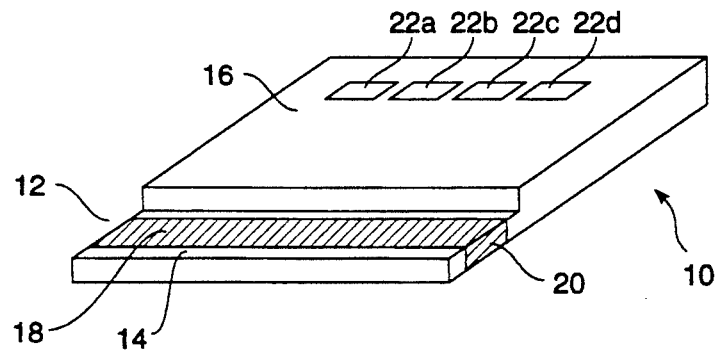
FIGS. 1a and 1b are perspective views of a laser diode bar carrier according to a presently preferred embodiment of the invention showing two different illustrative variations of power-distribution metallization.
Figure 1B:
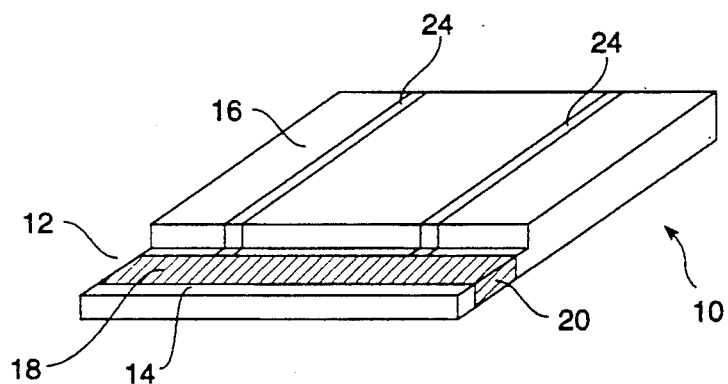

Referring first to FIGS. 1a and 1b, two perspective views of a laser diode bar carrier according to the present invention are shown illustrating two illustrative variations of power-distribution metallization patterns. As may be seen from FIGS. 1a and 1b, the laser diode bar carrier of the present invention preferably comprises a block 10 of dielectric material having a high thermal conductivity. Materials suitable for use in the present invention include diamond and beryllium oxide. Block 10 may be generally rectangularly shaped, but those of ordinary skill in the art will understand that other shapes are possible.

Block 10 is provided with a stepped portion 12. According to a presently preferred embodiment of the invention, stepped portion 12 is dimensioned such that the height of the step is chosen to be substantially equal to half the height of a laser diode emitter bar. The stepped portion 12 of carrier 12 is adapted to receive a laser diode bar. Stepped portion 12 has a mounting face 14 thereon for mounting a laser diode bar thereto. Carrier 10 also includes a mating face 16.

A conductive layer of material may be formed and patterned on the face of the carrier 10 to supply one power supply voltage potential to the commonly connected emitters via the conductive adhesive using one of a number of available technologies. Two variations of such a power distribution metallization are shown in FIGS. 1a and 1b, respectively.

In FIG. 1a, a conductive strip 18, preferably formed from a metal such as a titanium-platinum-gold or chrome-gold sandwich, or other standard semiconductor metallization materials is shown formed on mounting face 14. Conductive strip 18 has a portion 20 wrapped around one edge to the side of carrier 10 to form a connecting site. Conductive strip 18 serves two purposes. It serves as a bonding substrate for attachment of a laser diode bar, and also serves as the common connections between one terminal of each emitter in the diode bar and a first power supply potential.

A plurality of conductive wire bonding pads 22a, 22b, 22c, and 22d may also be provided on mating face 16 of carrier 10. Wire bonding or other suitable available technology may be used to connect a second power supply potential to the other terminal of each laser diode emitter on a laser diode bar. A typical application of this type employing wire bonding pads is shown and will be disclosed with reference to FIG. 2.

Another illustrative variation of the connectivity options possible when employing the carriers of the present invention is shown in FIG. 1b, lwherein a conductive strip 18 (or series of bonding pads (not shown)) is provided with one or more lead lines 24 extending up the step and across the mating face 16 of carrier 10. The lead lines 24 may be folded over an edge of mating face 16 to serve as connection points to a power supply potential.

In a typical application, carrier 10 will be formed from synthetic diamond, but could be formed from any insulating material having a high thermal conductivity, such as boron nitride. Alternatively, carrier 10 could be formed from a high thermal conductivity conductive material such as copper or aluminum, provided that it is coated with an insulating material so as to permit attachment of the conductive leads to the laser diode emitters without short circuits.

When carrier 10 is formed from diamond, it can be formed as a rectangular block and the step may be etched using a process such as masked plasma etching or other well known techniques. Alternatively, carrier 10 may be formed in several ways which incorporate the step feature, such as by consolidation of particulate diamond in a preform which incorporates the step features disclosed in co-pending U.S. patent application Ser. No. 07/704,997, filed Feb. 28, 1991, now abandoned, expressly incorporated herein by reference, or by performing a diamond growth process on a substrate, such as silicon, which incorporates a negative image of the step feature.

When formed from diamond, carrier 10 will typically have a width (the dimension parallel to the step) of about 1 cm, and will in fact depend on the length of the laser diode bar to be mounted. The thickness of the thin stepped portion will typically be between about 200-300 microns, and will depend on the thickness of the laser diode bar if two carriers are to be stacked with the bar sandwiched in between them. The thickness of the carrier 10 beyond the stepped portion will typically be about 300-400 microns, depending on the trade-off between production cost and the need to provide adequate heat transfer.

Figure 2:
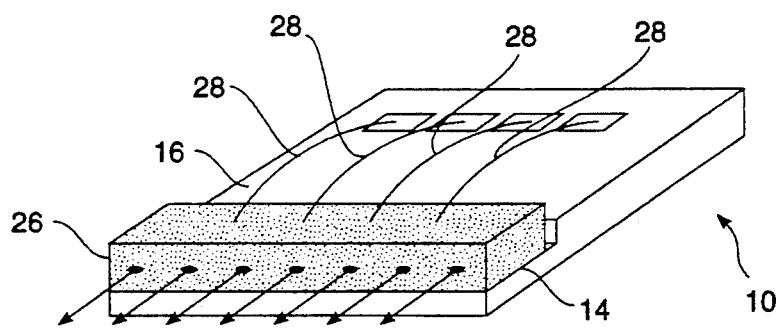
FIG. 2 is a perspective view of the laser bar carrier of FIG. 1a showing laser diode bar mounted thereon.

Referring now to FIG. 2, a perspective view of an assembly comprising a carrier 10 and a laser diode emitter bar 26 disposed on the mounting face 14 of the stepped portion 12 thereof. The laser diode bar 26 may be affixed to the mounting face 14 of the stepped portion 12 of carrier 10 using a suitable bonding or adhesive technology, such as gold/germanium eutectic or indium alloy solder, which provides mechanical strength and good thermal conductivity. Such adhesive technologies also provide a common electrical connection to the power terminations of the laser diode emitters located on the face of the bar bonded to the carrier 10.

To complete the laser diode bar carrier assembly of the present invention, a second carrier is placed over the assembly of FIG. 2, such that the mating faces of both carriers are in contact. The second carrier is bonded to the first carrier at their mating faces. The second carrier may preferably also be coated with a patterned electrically conductive material such as shown in FIGS 1a and 1b or other variations, such that when the laser diode bar is placed in contact with it, a suitable electrical connection is made to supply power for operation of the laser diodes. Workers of ordinary skill in the art will recognize numerous ways to provide these electrical connections.

Those of ordinary skill in the art will also recognize that a single laser diode bar may be used as mounted in FIG. 2, with connections between the emitter connection terminations and the other end of the power supply made by wire bonding or other suitable technology to the exposed connection terminations. FIG. 2 illustrates such a situation wherein a bonding wire 28 is bonded to one terminal of one of a plurality of diode emitters on laser diode bar 26 mounted on a carrier 10 such as the one depicted in FIG. 1a. The other end of each bonding wire is bonded to one of bonding pads 22a, 22b, 22c, and 22d.

Figure 3:
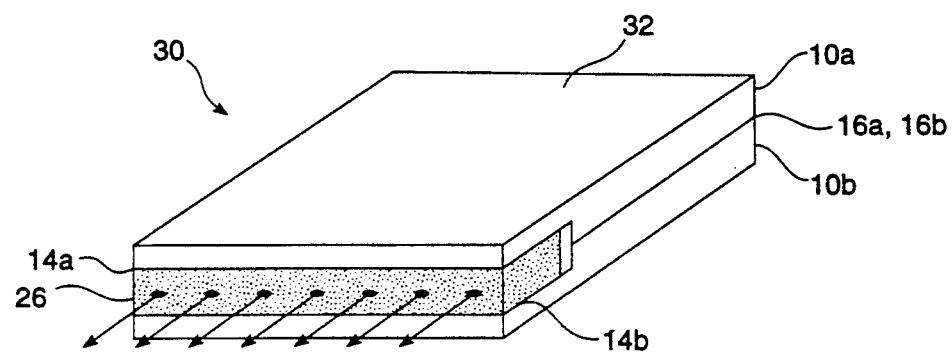
FIG. 3 is a perspective view of the laser bar carrier and laser diode bar assembly of FIG. 2 further including a second laser diode bar carrier disposed over the top of the first carrier and the laser diode bar.

FIG. 3 is a perspective view of such a laser diode bar carrier assembly 30, including first carrier 10a and second carrier 10b having their mating faces 16a and 16b in contact with one another. Laser diode bar 26 is held in place in contact with the opposed mounting faces 14a and 14b and electrical connections through metal contacts placed on opposed mounting faces 14a and 14b. From an examination of FIGS. 2 and 3, it may be seen that the mounting faces 14 and mating faces 16 of carriers 10a and 10b should have a sufficient surface flatness to promote easy assembly and a thickness adequate to provide the desired thermal conductivity.

The present invention provides numerous advantages over existing prior art laser diode mounting technology. Those of ordinary skill in the art will appreciate that the mounting scheme of the present invention interposes the minimum thermal barrier between the diode laser junction heat sources and the heat rejection site. Because heat is removed from laser diode arrays during operation from more than one side of the devices, the operating temperature of the devices and thermal stresses are reduced, thus contributing to device longevity, optical stability, and efficiency. Because of its structure, the present invention also provides a set of assembly properties which are superior to existing packaging schemes for laser diode arrays.

Figure 4:
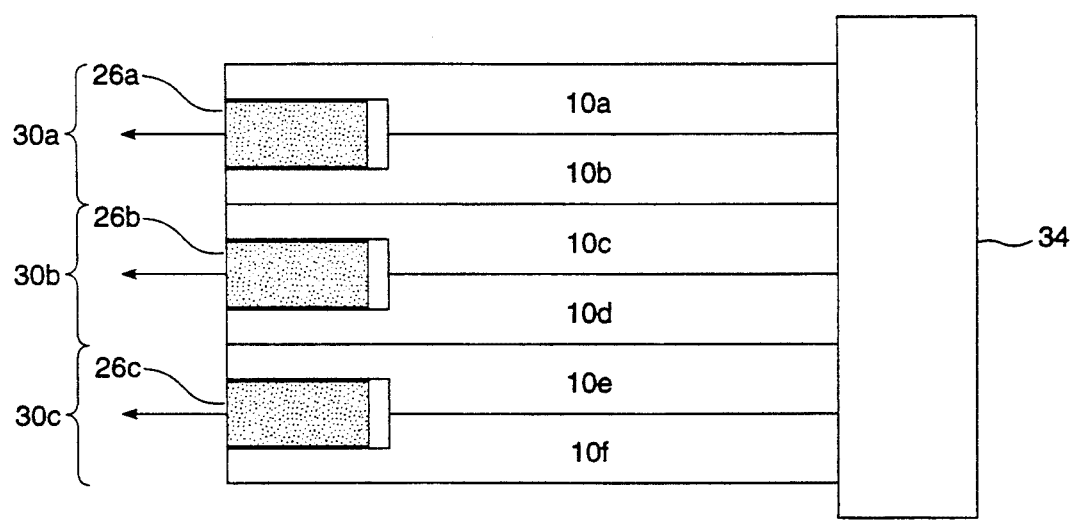
FIG. 4 is a cross-sectional view of a stacked array comprising an assembly of laser diode bar carriers and laser diode bars illustrating the use of the present invention.

These advantages of the present invention may be seen by an examination of FIG. 3, or of FIG. 4. Referring now to FIG. 4, a cross-sectional view of an assembly according to the present invention is shown comprising a plurality of laser diode bar carrier assemblies 30a, 30b, and 30c, each having a laser diode bar 26a, 26b, and 26c, respectively, mounted to the mounting faces of opposing pairs of carriers 10a-10b, 10c-10d, and 10e-10f thereof. Coupling faces 32 (shown in FIG. 3) of carrier pairs 10a-10b, 10c-10d, and 10e-10f are in contact with one another and may be bonded together by use of a suitable bonding material preferably having a high thermal conductivity. Carrier pairs 10a-10b, and 10e-10f may be bonded to a master carrier 34 to complete the assembly.

Because the three subassemblies like that shown in FIG. 3 comprising carrier pair 10a-10b and laser diode bar 26a, carrier pair 10c-10d and laser diode bar 26b, and carrier pair 10e-10f and laser diode bar 26c, are assembled separately, they may be separately tested prior to incorporation into the larger assembly shown in FIG. 4. This provides a significant advantage, since prior art assemblies of the size shown in FIG. 4 had to be completely assembled prior to testing to determined whether the laser diode arrays are functional.

The existence of one or more partially or wholly defective laser diode bars in a completed assembly the size of the assembly shown in FIG. 4 represents a large rework and wasted materials cost. Using the present invention, however, testing of the individual subassemblies is permitted. In addition, if a defective laser diode bar is encountered in a sub-assembly like that shown in FIG. 3, the defective laser diode array may be removed by debonding by appropriate procedures such as heating, and the carrier halves 10a and 10b of the assembly may be reused, thus significantly reducing both rework time and wasted material.

Practicing the teachings of the present invention allows utilization of fewer and/or less complex parts during laser diode array assembly, and provides an assembly having greater mechanical stability, reliability, and lower cost. The present invention also contributes to reduced assembly yield loss. Laser diode bars may be tested as individual subunits and, if bad, may be discarded before their integration into a large, expensive array requires expensive rework steps. In addition, in contrast with mounting schemes which require the fabrication of numerous slots, grooves, or trenches in a thermally conductive medium, the laser diode mounting technique according to the present invention requires no such fabrication of fragile slots in hard-to-work material. Such slots are prone to breakage, and breakage of one slot ruins the entire slotted package. Finally, use of the present invention allows assembly operation which are less mechanically complex, thus reducing the probability of laser diode bar failure due to mechanical stresses during assembly.

In addition, the present invention permits improved alignment of the laser bars (an important parameter), due to the enhanced precision with which the mounting surfaces can be fabricated and the resulting precision with which the laser diode array bars can be mated to those mounting surfaces. Metallization patterns can be more advantageously fabricated to connect the laser diode arrays in parallel, series, or any combination thereof. In particular, the present method lends itself to distribution of power to individual diodes, making possible compensation for individual diode variation, and enabling phase or frequency modulation.

The laser diode array packaging structure and method of the present invention enables a new level of performance to be obtained from these thermally-limited devices. Output power, device longevity, beam quality, and other laser diode parameters are improved by use of this packaging scheme. The laser diode packaging structure and assembly of the present invention is particularly useful for applications such as diode pumped solid state lasers, and other applications requiring high laser diode output power.

While embodiments and applications of this invention have been shown and described, it would be apparent to those skilled in the art that many more modifications than mentioned above are possible without departing from the inventive concepts herein. The invention, therefore, is not to be restricted except in the spirit of the appended claims.

What is claimed is:

1. A mounting assembly for a laser diode array, including:
   a first carrier, said first carrier comprising a generally rectangularly shaped block formed from a dielectric material having a high thermal conductivity, said block having a stepped recess therein, said stepped recess having a height essentially equal to one half the height of the laser diode array and having a mounting face on a first side thereon, said block also having a mating face on said first side and a coupling face on a second side opposite from said first side;
   a second carrier, said second carrier comprising a generally rectangularly shaped block formed from a dielectric material having a high thermal conductivity, said block having a stepped recess therein, said stepped recess having a height essentially equal to one half the height of the laser diode array and having a mounting face on a first side thereon, said block also having a mating face on said first side and a coupling face on a second side opposite from said first side;
   said mating faces of said first and second carriers bonded to one another with a high thermal conductivity bonding material, said first and second carriers oriented such that their stepped portions are opposed from one another in a facing relationship to form a laser diode cavity between the mounting faces thereof;
   a laser diode array disposed in said laser diode cavity and bonded to said mounting faces of said first and second carriers with a high thermal conductivity bonding material, said laser diode array having electrical terminations in contact with said contact means; and
   contact means, disposed on at least one of said mating faces of said first and second carriers, said contact means positioned to provide electrical contact to laser emitters located on a side of said laser diode array in contact with said mounting faces on said first and second carriers.

2. The mounting assembly of claim 1 wherein said first and second carriers are formed from beryllium oxide.

3. The mounting assembly of claim 1 wherein said first and second carriers are formed from diamond.

4. A stackable carrier for a laser diode bar comprising:
   a generally rectangularly shaped block formed from a dielectric material having a high thermal conductivity, said block having a single stepped recess therein, said single stepped recess having a height essentially equal to one half the height of said laser diode bar and having a mounting face thereon; and
   laser diode contact means for providing electrical contact to laser diode emitters to be mounted on said carrier.

5. The carrier of claim 4 formed from beryllium oxide.

6. The carrier of claim 4 formed from diamond.

7. The carrier of claim 4, further including a laser diode bar mounted on said mounting face, said laser diode bar having electrical terminations in contact with said contact means.

8. A mounting assembly for a plurality of laser diode bars, comprising:
   a first carrier pair including first and second carriers each comprising a generally rectangularly shaped block formed from a dielectric material having a high thermal conductivity, said block having a stepped recess therein, said stepped recess having a height essentially equal to one half the height of said laser diode bar and having a mounting face on a first side thereon, said block also having a mating face on said first side and a coupling face on a second side opposite from said first side, said mating faces of said first and second carriers of said first carrier pair bonded to one another with a high thermal conductivity bonding material, said first and second carriers of said first carrier pair oriented such that their stepped portions are opposed from one another in a facing relationship to form a first laser diode cavity between the mounting faces thereof;
   a first laser diode array disposed in said laser diode cavity and bonded to said mounting faces of said first and second carriers of said first carrier pair with a high thermal conductivity bonding material, said laser diode array having electrical terminations in contact with said contact means;
   first laser diode contact means, disposed on at least one of said mating faces of aid first and second carriers of said first carrier pair, said first laser diode contact means positioned to provide electrical contact to laser emitters located on a side of said laser diode bar in contact with said mounting faces of said first and second carriers of said first carrier pair;
   a second carrier pair including said first and second carriers, said mating faces of said first and second carriers of said second carrier pair bonded to one another with a high thermal conductivity bonding material, said first and second carriers of said second carrier pair oriented such that their stepped portions are opposed from one another in a facing relationship to form a second laser diode cavity between the mounting faces thereof;
   a second laser diode array disposed in said laser diode cavity and bonded to said mounting faces of said first and second carriers of said second carrier pair with a high thermal conductivity bonding material, said laser diode array having electrical terminations in contact with said contact means; and
   second laser diode contact means, disposed on at least one of said mating faces of said first and second carriers of said second carrier pair, said first laser diode contact means positioned to provide electrical contact to laser emitters located on a side of said laser diode bar in contact with said mounting faces of said first and second carriers of said second carrier pair;
   one of said coupling faces of said first and second carrier pairs from each of said first and second carrier pairs in contact with one another and bonded to one another with a high thermal conductivity bonding material in an orientation such that said first and second laser diode cavities are aligned with one another.

* * * * *

UNITED STATES PATENT AND TRADEMARK OFFICE
CERTIFICATE OF CORRECTION

PATENT NO. : 5,325,384
DATED : June 28, 1994
INVENTOR(S) : John A. Herb, John M. Pinneo It is certified that error appears in the above-indentified patent and that said Letters Patent is hereby corrected as shown below:

Column 3, line 33, after "carrier" insert --10--.
Column 3, line 37, after "carrier" insert --10--.
Column 3, line 38, after "block" insert --10--.
Column 3, line 41, replace "Block" with --carrier--.
Column 3, line 44, replace "Block" with --carrier--.
Column 3, line 49, replace the second "12" with --10--.

Column 5, line 61, after "10a-10b," insert --10c-10d,--.
Column 7, line 40, replace "on" with --of--.

Column 4, line 36, after "application", insert --ser. No. 08/513,313, filed Aug. 10, 1991, which is a file-wrapper-continuation of--.

Signed and Sealed this

Ninth Day of July, 1996

Attest:

BRUCE LEHMAN

Attesting Officer

Commissioner of Patents and Trademarks